United States Patent
Komatsu et al.

[11] Patent Number: 5,591,562
[45] Date of Patent: Jan. 7, 1997

[54] WATER AND ACID DEVELOPABLE PHOTORESIST COMPOSITION EXHIBITING IMPROVED ADHESION

[75] Inventors: Nobuo Komatsu, Kanagawa; Ikuyo Kai; Nami Konishi, both of Tokyo; Naozumi Iwasawa; Satoru Furusawa, both of Kanagawa, all of Japan

[73] Assignee: Sony Corporation, Tokyo, Japan

[21] Appl. No.: 322,415

[22] Filed: Oct. 13, 1994

[30] Foreign Application Priority Data

Oct. 15, 1993 [JP] Japan .................. 5-258620

[51] Int. Cl.⁶ .................. G03C 1/725
[52] U.S. Cl. .................. 430/280.1; 430/281.1; 522/31; 522/103
[58] Field of Search .................. 430/281, 280.1, 430/281.1; 522/31, 103

[56] References Cited

U.S. PATENT DOCUMENTS

| | | |
|---|---|---|
| 4,302,373 | 11/1981 | Steinmetz . |
| 4,338,232 | 7/1982 | Harris et al. . |
| 4,431,782 | 2/1984 | Harris et al. . |
| 4,684,676 | 8/1987 | Diefenbach et al. . |
| 4,789,620 | 12/1988 | Sasaki et al. .................. 430/281.1 |
| 4,798,877 | 1/1989 | Hoffman et al. . |
| 4,855,215 | 8/1989 | Nakano et al. .................. 430/283.1 |
| 4,943,516 | 7/1990 | Kamayachi et al. .................. 430/281.1 |
| 5,093,223 | 3/1992 | Iwasawa et al. . |

FOREIGN PATENT DOCUMENTS

| | | |
|---|---|---|
| 3534527 | 4/1986 | Germany . |
| 3-115845 | 4/1990 | Japan . |
| 2115845 | 4/1990 | Japan . |
| 2213488 | 11/1991 | United Kingdom . |

*Primary Examiner*—Mark Chapman
*Attorney, Agent, or Firm*—Hill, Steadman & Simpson

[57] ABSTRACT

A photopolymerizable composition suitable as a solder resist and capable of forming a resist film having characteristics in no way inferior to those of the conventional heat-curable type or organic solvent developed type solder resist, with the use of water or a dilute aqueous solution which is completely innocuous and higher in safety than the aqueous alkaline solution, and a method for producing a cured coated film pattern using the photopolymerizable composition.

14 Claims, 1 Drawing Sheet

WATER AND ACID DEVELOPABLE PHOTORESIST COMPOSITION EXHIBITING IMPROVED ADHESION

BACKGROUND OF THE INVENTION

This invention relates to a photopolymerizable composition. More particularly, it relates to a photopolymerizable composition which is suited above all to a solder resist for preparation of a printed circuit board since it is capable of forming a cured coating film which is superior in adhesion to a substrate, thermal resistance and in resistance to chemicals and from which an uncured coating film can be removed simply on flushing with water. The present invention also relates to a method of forming a cured coating film pattern using the photopolymerizable composition.

Up to now, when soldering components to a printed board, a solder resist is applied to the surface of the printed board for avoiding adhesion of the solder to other than desired portions and for protecting the circuit on the printed board surface. The solder resist is applied in many cases by printing a resist composition as a desired pattern on the printed board such as by silk screen printing and subsequently by curing the printed pattern by heating or by active rays such as UV rays. Recently, with the tendency towards a higher density of the printed board, a liquid photoresist type solder resist having high pattern forming precision has been proposed. That is, a liquid photopolymerizable solder resist is applied by silk screen printing or roll coater printing on the printed board and dried on heating. A film having a desired pattern drawn thereon is tightly contacted with the coating film, and active rays, such as UV rays, is radiated for curing the exposed portion. An unexposed portion is removed by dissolution with a developing solution, and the cured portion is post-cured using heating or irradiation with active rays for forming a circuit protective film and a soldering pattern formed by the soldering resist.

With the above-mentioned conventional solder resist, an organic solvent is mainly employed as the developing solution. A developing solution employing an aqueous alkali solution in place of the organic solvent has also been developed. However, the solder resist employing the organic solvent as the developing solution presents problems such as conflagration or toxicity to a human body. On the other hand, the solder resist employing the aqueous alkali solution as the developing solution is inferior in properties of the resist film formed thereby to the solder resist of the heat curable type or of the type developed by the organic solvent.

SUMMARY OF THE INVENTION

It is therefore an object of the present invention to provide a photopolymerizable composition suited as a solder resist capable of forming a resist film having characteristics comparable to that formed from the solder resist of the heat curable type or of the type developed by the organic solvent without the risk of conflagration or toxicity to a human body, and a method for forming a cured coating film pattern using the photopolymerizable composition.

The present inventors have conducted eager searches and found that, by adding a specified amount of mica of a pre-set particle size or a specified polymerizable unsaturated monomer to a specified photopolymerizable composition as disclosed in JP Patent Kokai (laid-open) Publication No. 2-1858, it becomes possible to produce a resist film having characteristics in no way inferior to those of the conventional heat-curable type or organic solvent developed type solder resist, with the use of water or a dilute aqueous acid solution which is completely innocuous and higher in safety than the aqueous alkaline solution, so that it becomes possible to produce a photopolymerizable composition suitably employed as a solder resist.

In one aspect, the present invention provides a photopolymerizable composition mainly composed of an aromatic epoxy resin derivative containing 0.3 to 10 mols/kg of a polymerizable unsaturated group and 0.1 to 3 mols/kg of a non-protonic onium salt containing group represented by the formula $$-\underset{\underset{OH}{|}}{CH}-CH_2-W^{\oplus}.O^{\ominus}COR_1 \qquad (1)$$

wherein $R_1$ denotes a hydrogen atom or a hydrocarbon group with 1 to 8 carbon atoms, occasionally substituted by a hydroxy group, an alkoxy group, an ester group or a halogen atom, $-W^{\oplus}$ denotes

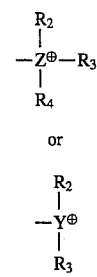

Z being a nitrogen atom or a phosphorus atom, Y being a sulphur atom, and wherein $R_2$, $R_3$ and $R_4$ may be the same or different and denotes organic groups with 1 to 14 carbon atoms,. $R_2$ and $R_3$ or $R_2$, $R_3$ and $R_4$ together occasionally forming a heterocyclic group along with a nitrogen atom, a phosphorus atom or a sulphur atom bonded thereto. The composition also contains a photopolymerization initiator and mica with a mean particle size of 1 to 10 μm in amounts of 0.1 to 10 parts by weight and 1 to 15 parts by weight to 100 parts by weight, respectively, of the aromatic epoxy resin derivative.

In another aspect, the present invention provides a photopolymerizable composition composed of the aromatic epoxy resin derivative as defined above and containing a photopolymerization initiator in an amount of 0.1 to 10 parts by weight to 100 parts by weight of the aromatic epoxy resin derivative and also containing a polymerizable unsaturated monomer in an amount of 1 to 15 parts by weight to 100 parts by weight of the aromatic epoxy resin derivative. The polymerizable unsaturated monomer is represented by the chemical formula 2

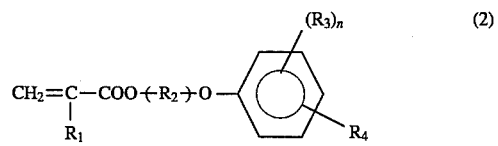

wherein $R_1$ denotes a hydrogen atom or a methyl group, $R_2$ denotes an alkylene group with 1 to 12 carbon atoms, $R_3$ denotes alkyl groups, with 1 to 4 carbon atoms, which may be the same or different groups, and $R_4$ denotes an alkyl group with 5 to 12 carbon atoms, n being an integer of from 0 to 3.

In still another aspect, the present invention provides a method for producing a cured coating film pattern comprising the steps of coating a photopolymerizable composition as defined above on a substrate, drying the thus formed coating film, exposing the coating film to light via a photomask having a desired circuit pattern, rinsing the coating film with water for removing an unexposed portion, and subjecting the coating film carrying the circuit pattern to heating.

Since the photopolymerizable composition of the present invention is mainly composed of the aromatic epoxy resin derivative containing non-protonic onium salt containing groups, water or a dilute aqueous acid solution may be employed as a developing solution, so that it becomes possible to avoid the risk such as conflagration or safety and hygienic problems such as toxicity to a human body. In addition, since the cured coating film is improved in adhesion to the substrate by the addition of mica having a pre-set particle size and the specified polymerizable monomer, it becomes possible to produce a cured coating film having comparable characteristics to those of the conventional heat curable or organic solvent developed type solder resist.

DETAILED DESCRIPTION OF THE INVENTION

Figure 1:
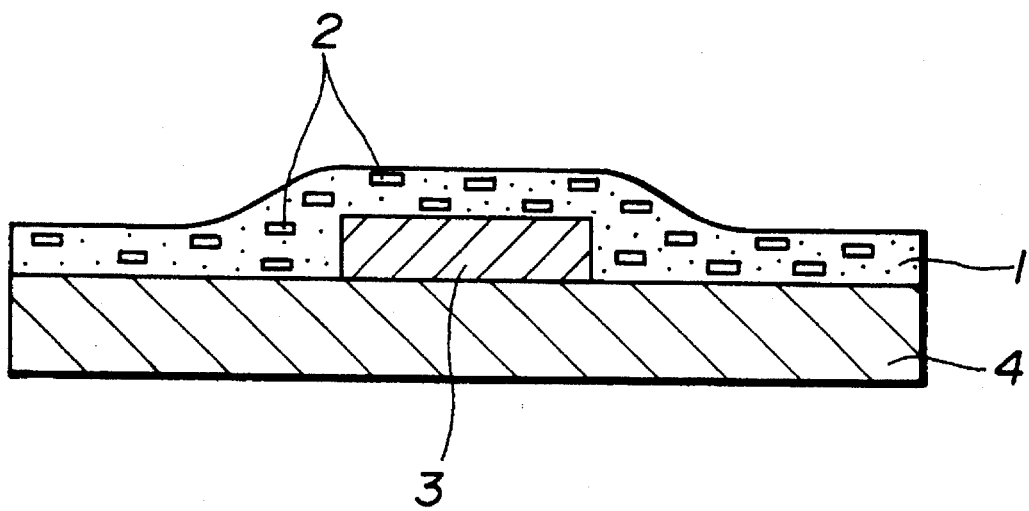
FIG. 1 is a schematic enlarged cross-sectional view showing the state of coating of the photopolymerizable composition on the printed board.

It is necessary for the aromatic epoxy resin derivative in the photopolymerizable composition of the present invention to contain polymerizable unsaturated groups and the non-protonic onium salts represented by the chemical formula 1 in the resin. For producing the aromatic epoxy resin derivative, it suffices to introduce the polymerizable unsaturated groups and the non-protonic onium salt containing groups in the resin.

The polymerizable unsaturated groups may be introduced into the epoxy resin as the cations of the onium salts, or introduced into the anions by employing carboxylic acid having polymerizable unsaturated groups, such as acrylic acid, methacrylic acid, crotonic acid, monomethyl maleinate, monomethyl fumarate or monomethyl itaconate.

The aromatic epoxy resin may be enumerated by diglycidyl ether compounds, such as hisphenol A, hisphenol F or hisphenol S, polymers of these diglycidyl ether compounds with phenol novolak type epoxy resin, cresol novolak type epoxy resin, triglycidyl isocyanurate or halogenides thereof. These epoxy resins may also be partially modified with, for example, benzoic acid. In view of reactivity, the content of the epoxy groups in the aromatic epoxy resin is preferably 0.1 mol or more to 1 kg of the resin. Although there is no limitation to the molecular weight of the resin, it is preferred that the resin be of a weight average molecular weight of approximately 500 or more in view of finger-touch drying properties in the formation of the cured coating film such as resist and approximately 5000 or less in view of coating workability.

The polymerizable unsaturated groups may be enumerated by acryloyl-, methacryloyl-, itaconyl-, maleoyl-, fumaroyl-, crotonoyl-, acrylamido-, methacrylamido-, cinnamoyl-, vinyl- or allyl groups.

The non-protonic onium salt containing groups are those represented by the chemical formula 1. It is also necessary for the carbon atom from the β-position from the nitrogen atom, phosphorus atom or the sulfur atom of the onium salt to have secondary hydroxyl groups. These non-protonic onium salts are one of the quaternary ammonium salts, quaternary phosphonium salts or the tertiary phosphonium salts. Concrete examples of the cations in the non-protonic onium salt containing group are shown in the following chemical formulas 3, 4 and 5:

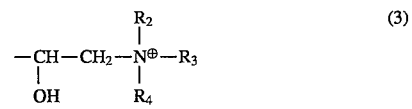

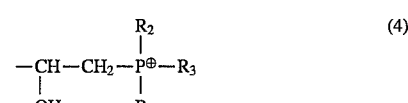

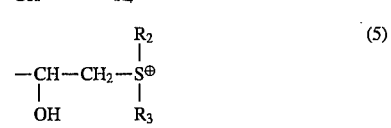

There is no particular limitation to the organic groups having 1 to 14 carbon atoms represented by $R_2$, $R_3$ and $R_4$ in the above chemical formulas 3 to 5, provided that these organic groups do not substantially obstruct ionization of the ammonium salt groups, phosphonium salt groups or supfonium salt groups. Thus, C1 to C14 hydrocarbon groups capable of containing hetero atoms, such as oxygen atoms, in the form of hydroxyl or alkoxy groups, are usually employed as the organic groups.

These hydrocarbon groups may be enumerated by aliphatic, alicyclic or aromatic hydrocarbon groups, such as alkyl groups, cycloalkyl groups, cycloalkylalkyl groups, aryl groups or aralkyl groups. The aralkyl groups may be straight-chained of branched, and are preferably lower groups with not more than eight carbon atoms. Thus the alkyl groups may be enumerated by methyl, ethyl, n-or iso-propyl, n-butyl, iso-butyl, sec-butyl, tert-butyl, pentyl, heptyl or octyl groups. The cycloalkyl or cycloalkylalkyl are preferably C5 to C8 groups and may be enumerated by cyclopentyl, cyclohexyl, cyclohexylmethyl and cyclohexylethyl groups. The aryl groups may be enumerated by phenyl, toluyl and octyl groups. As the aralkyl groups, the benzyl group is most preferred.

Preferred examples of the hydrocarbon groups containing the hetero atoms, such as oxygen atoms, include hydroxyalkyl groups, above all, hydroxy lower alkyl groups, such as hydroxymethyl, hydroxyethyl, hydroxybutyl, hydroxypentyl, hydroxyheptyl or hydroxyoctyl groups, and alkoxyalkyl groups, above all, lower alkoxy lower alkyl groups, such as methoxy methyl, ethoxy methyl, ethoxy ethyl, n-propoxyethyl, iso-propoxy methyl, n-butoxy methyl, iso-butoxy ethyl and tert-butoxy ethyl groups.

—$W^+$ in case of $R_2$ and $R_3$ or $R_2$, $R_3$ and $R_4$ together forming a heterocyclic group along with a nitrogen atom, a phosphorus atom or a sulphur atom bonded thereto may be exemplified by those having the following chemical formulas 6 to 14:

-continued

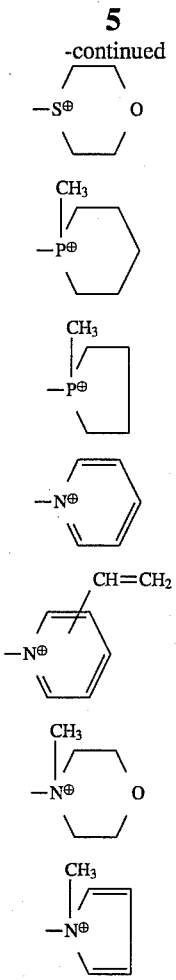

(8) $-S^{\oplus}\langle O \rangle$ (9) $-P^{\oplus}$ with $CH_3$

(10) $-P^{\oplus}$ with $CH_3$

(11) $-N^{\oplus}$

(12) $-N^{\oplus}$ with $CH=CH_2$

(13) $-N^{\oplus}\langle O \rangle$ with $CH_3$

(14) $-N^{\oplus}$ with $CH_3$

The C1 to C8 hydrocarbon groups represented by $R_1$ in the chemical formula 1, the hydroxyl-, alkoxy- or ester groups or halogen atoms of which may be substituted, may be enumerated by aliphatic, alicyclic or aromatic hydrocarbon groups, such as alkyl-, alkenyl-, cycloalkyl-, cycloalkylalkyl-, aryl- or aralkyl groups. Of these, the alkyl and alkenyl groups are preferred. These groups may be straight-chained or branched and preferably lower groups. Examples of the alkyl and alkenyl groups include methyl, ethyl, n- or iso-propyl, n-, iso-, sec- or tert-butyl, pentyl, heptyl, octyl, vinyl and 2-methylvinyl groups. Preferred examples of the hydroxy-substituted hydrocarbon groups include hydroxy alkyl groups, above all, hydroxy lower alkyl groups, specifically, hydroxymethyl, hydroxyethyl, hydroxybutyl, hydroxypentyl, hydroxyheptyl and hydroxyoctyl groups. Preferred examples of alkoxy-substituted hydrocarbon groups include alkoxyalkyl groups, above all, lower alkoxy lower alkyl groups, specifically, methoxymethy, ethoxyethyl, ethoxyethyl, n-propoxyethyl, iso-propoxymethyl, n-butoxymethyl, iso-butoxyethyl and tert-butoxyethyl groups. Preferred examples of ester-substituted hydrocarbon groups include lower alkoxy carbonyl alkyl groups and lower alkoxy carbonyl alkenyl groups, specifically, methoxy carbonyl methyl, propoxy carbonyl ethyl, ethoxy carbonyl propyl, methoxy carbonyl butyl, methoxy carbonyl ehylenyl or ethoxy carbonyl ehylenyl groups. Preferred examples of halogen-substituted hydrocarbon groups include chloromethyl, bromomethyl, iodomethyl dichloromethyl, trichloromethyl, chloroethyl and chlorobutyl.

The polymerizable unsaturated groups in the aromatic epoxy resin derivative is preferably in a range from 0.3 to 10 mols per kg of the solid content of the resin in view of curability. If the amount of the unsaturated groups is less than 0.3 mol, the resin can be cured only insufficiently. Conversely, if the amount of the unsaturated groups becomes larger than 10 mols, the mechanical properties of the cured mass tend to be lowered.

The amount of the non-protonic onium salt containing groups is preferably in a range from 0.1 to 3 mols and preferably from 0.3 to 2 mols per kg of the solid content of the resin. If the amount is less than 0.1 mol, curing becomes undesirably insufficient, whereas, if it exceeds 3 mols, the cured mass undesirably tends to be lowered in waterproofness.

The polymerizable unsaturated groups can be introduced into the aromatic epoxy resin by any known means. For example, (i) an addition reaction of a carboxyl group to an epoxy group and (ii) an addition reaction of a hydroxy group with an epoxy group may be utilized. If there is a hydroxy group in the epoxy resin, (iii) an esterification reaction of the carboxyl group with the hydroxy group, (iv) an addition reaction of an isocyanate group and a hydroxy group, (v) a half-esterification reaction between an acid anhydride and a hydroxy group or (vi) an ester exchange reaction between the ester group and the hydroxy group, may be utilized, with the use of compounds having functional groups capable of reacting with the functional group in the epoxy resin and with the polymerizable unsaturated group.

Of the above reactions, the reactions (i), (ii) and (iv) will now be explained as typical.

The compounds containing the polymerizable unsaturated groups and carboxyl groups, that may be employed in the reaction (i), may be enumerated by (meth)acrylic acid, crotonic acid, monoalkyl itaconate, monoalkyl maleinate and monoalkyl fumarate. The compounds having the polymerizable unsaturated groups and hydroxy groups, that may be employed in the reaction (ii), may be enumerated by monohydric alcohols having polymerizable unsaturated groups, such as 2-hydroxyethyl (meth)acrylate, 2-hydroxypropyl (meth)acrylate, allyl alcohol or N-methylol (meth)-acrylamide. As the compounds having the polymerizable unsaturated groups and isocyanate groups, that may be employed in the above reaction (iv), an equimolar adduct of the monohydric alcohols having the polymerizable unsaturated groups and the isocyanate groups and diisocyanate compounds, such as tolylene diisocyanate or isophorone diisocyanate, or a product produced by addition of m-isopropenyl-α,α-dimethyl benzyl isocyanate, may be employed.

The onium groups may be introduced into the aromatic epoxy groups by a method of simultaneously reacting tertiary amines, phosphines or thioethers and an organic acid with a resin having 1,2-epoxy groups in the absence of a solvent or in an inert organic solvent.

The reaction (i) in case of using a tertiary amine as the compound to be reacted with the resin may be carried out in a manner shown by the following chemical formula:

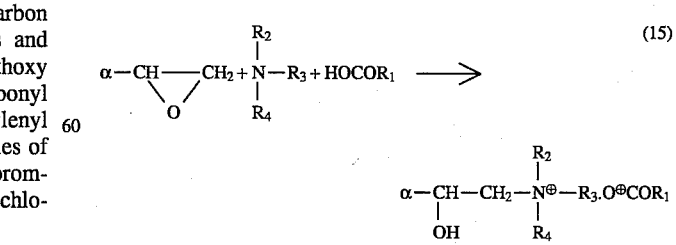

(15)

wherein α denotes the basic portion of the resin and $R_1$, $R_2$, $R_3$ and $R_4$ are as indicated in the chemical formula (1).

If phosphine is employed in place of the tertiary amine, it suffices to substitute P for N in the above reaction formula, whereas, if thioether is employed in place of the tertiary amine, it suffices to substitute S for N and to delete —R$_4$ in the above reaction formula. The reaction of the above resin, tertiary amine and the organic acid may be carried out under heating at approximately 40° to 80° C. and the reaction is completed in about 1 to 20 hours.

The onium salt may be introduced into the aromatic epoxy resin by reaction of a tertiary amine, phosphine or thioether with the resin having a 2-halogeno-1-hydroxyethyl group in the absence of a solvent or in an inert organic solvent followed by substitution of a hydroxy group for the halogen atom by a cation exchange and subsequent reaction of the resulting product with the organic acid.

The inert organic solvents employed for introducing the onium salt into heteroaromatic epoxy resin as described above may be enumerated by ether alcohol based solvents, such as ethylene glycol monobutyl ether or ethylene glycol monoethyl ether, ether-based solvents, such as dioxane, ethylene glycol diethyl ether, alcoholic solvents, such as ethanol, propanol or butanol, and ketonic solvents, such as methyl ethyl ketone or ethyl isobutyl ketone.

As the organic acids (HOCOR$_1$), any of well-known organic carboxylic acids may be employed, provided that these generate anions indicating C1 to C8 hydrocarbon groups in which R$_1$ may be replaced by a hydroxy group, an alkoxy group, an ester group or a halogen atom. Specifically, these organic acids may be enumerated by acetic acid, formic acid, trimethyl acetic acid, acrylic acid, methacrylic acid, lactic acid, hydroxyacetic acid, crotonic acid, chloroacetic acid, monomethyl maleinate, monoethyl fumarate and monomethyl itaconate. Of these acids, those having a dissociation constant (pKa value) not lower than $1 \times 10^{-5}$ are most preferred.

The photopolymerization initiator for the photopolymerizable composition according to the present invention may be any of the well-known customary compounds. Examples of the photopolymerization initiators include benzoin, benzoin methyl ether, benzoin ethyl ether, benzyl, diphenyl disulfide, tetramethyl thiuram monosulfide, eosine, thionine, diacetyl, Michler's ketone, anthraquinone, chloroanthraquinone, methyl anthraquinone, α-hydroxy isobutyl phenone, p-isopropyl α-hydroxy isobutylphenone, α,α'-dichloro-4-phenoxy acetophenone, 1-hydroxy 1-cyclohexyl acetophenone, 2,2-dimethoxy 2-phenylacetophenone, methyl benzoyl formate, 2-methyl-1-[4-(methythio) phenyl] -2-morpholino-propanone, thioxanthone and benzophenone. These may be employed in an amount ranging from 0.1 to 10 parts by weight to 100 parts by weight of the solid content of the resin. If the amount is less than 0.1 part by weight, curing properties tend to be lowered, whereas, if it exceeds 10 parts by weight, the mechanical strength of the cured mass tends to be lowered.

Meanwhile, the specific photopolymerizable composition disclosed in the aforementioned JP Patent Kokai (Laid-open) Publication 2-1858 is made up of the above-mentioned aromatic epoxy resin derivative and the photopolymerization initiator, and renders it possible to use a developing solution consisting in completely innocuous water or a dilute aqueous acid solution. However, if the photopolymerizable composition is coated on the printed board to form a cured coating film, a thin film portion having a dry film thickness of 5 to 15 μm tends to be partially produced on the circuit portion such that the cured coating film tends to be unstable in adhesion at corner regions of the circuit on which the thin film portions have been produced.

These film portions may be prevented from being produced by scrupulously controlling the coating conditions, such as coating thickness. However, the coating operation is disadvantageously lowered efficiency.

The present inventors have conducted eager searches and found that, in the first place, the above inconvenience may be overcome by adding mica having the mean particle size of 1 to 10 μm in an amount of 10 to 60 parts by weight to 100 parts by weight of the aromatic epoxy resin derivative in the photopolymerizable composition disclosed in the aforementioned JP Patent Kokai Publication 2-1858. That is, our searches have revealed that addition of flake-shaped additive, especially mica, to the photopolymerizable composition, leads to significant improvement in the adhesiveness of the cured coating film of the photopolymerizable composition onto the printed board.

In our researches, the possibility of employing substantially spherically-shaped inorganic fillers, such as barium sulfate or silica, was scrutinized. However, the cured coating film was not improved in adhesiveness to the printed board on addition of these fillers to the photopolymerizable composition. On the other hand, it was found that addition of flaky fillers, such as mica or talc, to the photopolymerizable composition, leads to significant improvement in adhesion of the cured coating film on the printed circuit board.

This is possibly attributed to the fact that, if the photopolymerizable composition admixed with the flaky filler 2 is coated on the printed board 4 having the circuit 3 formed thereon to form a cured coating film, as shown in FIG. 1, the filler 2 in the photopolymerizable composition is oriented in a direction parallel to the printed board because of its flake-like shape. Our further researches have revealed that, since talc is inferior to mica in its effect in improving adhesiveness and its use leads to the necessity of increasing its amount, thus giving rise to significant deterioration in the coating film surface hardness of the resulting photopolymerizable composition and inferior appearance of the coating film surface, talc is not a preferred material and mica is a preferred material.

The significant improvement achieved with the present invention may be realized only by a specified amount of mica of the specified particle size as mentioned above. If the mean particle size of the mica is less than 1 μm, it has only poor effect in improving adhesiveness, whereas, if it exceeds 10 μm, it becomes difficult to produce a smooth coating film and the coating film becomes inferior in appearance and quality. In addition, such inconvenience arises that resolution on formation of the cured coating film pattern is lowered. If the amount is less than 10 parts by weight, only poor effects in improving adhesiveness may be achieved, whereas, if the amount is more than 60 parts by weight, the photopolymerizable composition is significantly increased in coating viscosity, with the consequence that dispersibility of the mica in the photopolymerizable composition is deteriorated and coating difficulties are raised.

In the second place, it has been found that the above inconvenience may be overcome by having the polymerizable unsaturated monomers shown by the chemical formula 2 contained in an amount of 1 to 15 parts by weight to 100 parts by weight of the aromatic epoxy resin derivative in the photopolymerizable composition disclosed in the aforementioned JP Patent Kokai Publication No. 2-1858.

That is, our eager searches have revealed that, by adding the polymerizable unsaturated monomer having the structure shown by the chemical formula 2 to the photopolymerizable composition, the photopolymerizable composition may be significantly improved in adhesiveness to the printed board.

Our searches have also revealed that, if the polymerizable unsaturated monomer having a structure other than the structure shown by the chemical formula 2 is added to the photopolymerizable composition, only poor effects in improving adhesiveness can be produced, or thermal resistance is considerably deteriorated.

On the other hand, it may be contemplated that, if the polymerizable unsaturated monomer having the structure shown by the chemical formula 2 is added, significant effects in improving adhesiveness may be produced since the polymerizable unsaturated monomer has an aromatic ring in its molecule and hence is superior in compatibility with the resin, while having an alkylene chain in its molecular chain and being soft, high in thermal resistance and resistance against oxidation and monofunctional, so that it has high capabilities in releasing the stress of the formed coating film and hence has significant effects in improving adhesiveness.

Meanwhile, if the content of the polymerizable unsaturated monomer is outside the above range, sufficient effects in achieving adhesiveness cannot be produced.

The photopolymerizable composition according to the present invention may be made up only of the above-mentioned aromatic epoxy resin derivative, photopolymerization initiator, and the aforementioned mica or the polymerizable unsaturated monomer. However, in view of coatability, it is usually employed in the form of an organic solvent type composition or in the state of an aqueous solution or dispersion. In the latter case, the water-miscible solvent is employed at the time of preparation of the resin and the resulting resin liquid is added to by or placed in water.

There is no particular limitation to the above solvent provided that it is capable of dissolving or dispersing the aromatic epoxy resin derivative, photopolymerization initiator and, the mica or the polymerizable unsaturated monomer according to the present invention. Examples of the solvents include acetates, such as ethyl acetate or butyl acetate, glycol ethers, such as ethylene glycol, diethylene glycol or propylene glycol, aromatic hydrocarbons, such as toluene or xylene, alcohols, such as methanol, ethanol or butanol, and ketones, such as methylethylketone or methyl isobutyleketone. These solvents may be used singly or as a mixture in amounts which may be suitably adjusted depending on the method of coating the composition.

The photopolymerizable composition according to the present invention may be admixed with a curing catalyst for thermal curing, including alkali metal hydroxides, such as sodium hydroxide or lithium hydroxide, alkali earth metal hydroxides, such as calcium hydroxide or magnesium hydroxide, hydroxides, organic acid salts and alkoxides of metals selected from the group consisting of nickel, copper, molybdenum, lead, iron,. chromium, manganese, tin and cobalt. The amount of addition of these curing catalysts is preferably not more than 10 parts by weight and more preferably 0.1 to 5 parts by weight to 100 parts by weight of the aromatic epoxy resin derivative.

The photopolymerizable composition of the present invention may also be admixed with various additives, such as colored pigments, extenders, rust-proofing pigments, dyestuffs, thermoplastic polymers, polyfunctional vinyl monomers or oligomers, levelling agents, defoaming agents, and run-proofing agents. The colored pigments, extenders, rust-proofing agents and dyestuffs, commonly employed in the field of ink and paints, may be employed in an amount less than 50 wt % and preferably less than 30 wt % of the solid content in the photopolymerizable composition. Examples of the polyfunctional vinyl monomers or oligomers include trimethylolpropane tri(meth)acrylate, dipentaerythritol-(meth)acrylate, norbornene di(meth)acrylate and tricyclodecane methanol di(meth)acrylate. These polyfunctional vinyl monomers or oligomers or the thermoplastic polymers are preferably employed in amounts of not more than 30 wt % in the solid content in the photopolymerizable composition of the present invention.

For forming a cured coating film pattern using the photopolymerizable composition of the present invention, the photopolymerizable composition is coated on a substrate and the coating film thus formed is dried. The coating film is exposed to light using a photomask having a desired circuit pattern. The coating film is then exposed to light via a photomask having a desired circuit pattern. The coating film is washed with water for removing the unexposed portion, and the coating film having the circuit pattern is processed with heating.

The film is formed on the substrate by conventional methods such as spray coating, brushing, roll coating, dipping or silk screen printing, to a dry film thickness usually of 10 to 100 μm. The coated film thus formed is then dried at a temperature of, for example, not higher than 100° C. The coated film is exposed to light by radiating active light rays, such as UV rays, at a rate of 10 mj/cm$^2$ to 2000 mj/cm$^2$, preferably 100 mj/cm$^2$ to 1000 mj/cm$^2$. For exposure, any of conventional exposure devices, such as an ultra-high pressure mercury lamp or a high-pressure mercury lamp, may be employed. There is no limitation to water employed for removing unexposed portions, so that deionized water, distilled water, city water or industrial water, may be employed. The processing of the coating film by heating may be carried out at 120° to 180° C. for 10 to 60 minutes.

Several examples of the present invention will now be explained. That is, the photopolymerizable composition of the present invention was prepared and cured coated film patterns were formed from the composition in order to check into its characteristics. In the following description, indications of parts or % denote parts by weight and wt %, respectively.

Preparation of Solution of Aromatic Epoxy Resin Derivative

Two different types of the solution of the aromatic epoxy resin derivative for the preparation of the photopolymerizable composition were prepared. [Composition of Starting Material for Resin Derivative Solution A-1]

| | |
|---|---|
| Epikote 154 (manufactured by YUKA SHELL EPOXY CO. LTD, phenol novolak type epoxy resin, number average molecular weight, about 500, epoxy equivalent, about 174) | 500 parts |
| acrylic acid | 180 parts |
| tetraethyl ammonium bromide | 1.0 part |
| hydroquinone | 0.5 part |

The starting material of the above composition was charged into a flask, previously charged with 250 parts of ethylene glycol monobutyl ether, and was dissolved. The resulting solution was heated at 110° C. for five hours to produce an epoxy ester solution having a resin acid value of 0.5. This solution was cooled to about 50° C. and added to by 36 parts of N,N-dimethylethanol amine and 24 parts of acetic acid. The resulting mass was reacted at 70° C. for six hours to produce a resin derivative solution A-1 having the solid content of 75%. The solid content of the resin derivative contained 3.4 mols/kg of the polymerizable unsaturated groups and 0.55 mol/kg of quaternary ammonium salts.

[Composition of Starting Material for Resin Derivative Solution A-2]

| | |
|---|---|
| Epikote 190S80 (manufactured by YUKA SHELL EPOXY CO. LTD, cresol novolak type epoxy resin, number average molecular weight, about 1100, epoxy equivalent, about 210) | 500 parts |
| acrylic acid | 171 parts |
| thiodiglycol | 122 parts |
| methoxy hydroquinone | 0.5 part |

The starting material of the above composition was charged into a flask, previously charged with 350 parts of diethylene glycol monobutyl ether, and was dissolved. The resulting solution was heated at 70° C. for ten hours to produce a solution of a resin derivative A-2 having the solid content of 69%. The solid content of the resin derivative contained 3.0 mols/kg of the polymerizable unsaturated groups and 1.26 mol/kg of tertiary ammonium salts.

Preparation of Photopolymerizable Composition (1)

Using the solutions of the above resin derivatives A-1 and A-2, Examples 1 to 3 and Comparative Examples 1 to 4 of the photopolymerizable composition were prepared with the compositions shown in Table 1.

The photopolymerizable compositions of the Examples 2 and 3 and the Comparative Examples 1 to 4 were prepared in a similar manner. However, the photopolymerizable compositions of the Example 2 and the Comparative Example 2 were prepared by dilution in water after kneading, without dispersion in water during kneading with the test roll.

Formation of Cured Coating Film Pattern (1)

Using the photopolymerizable compositions of the Examples 1 to 3 and the Comparative Examples 1 to 4, cured coating film patterns were formed on printed boards. For example, the photopolymerizable composition of Example 1 was coated (printed) by the silk screen method on a pre-etched copper through-hole printed circuit board to a dry film thickness of 7 to 10 μm as measured at a planar portion of the circuit to form a coating film which was then dried at 70° C. for ten minutes. The coating film was exposed to light volumes of 400 mj/cm$^2$ and 800 mj/cm$^2$ via a photomask which is formed of a polyethylene terephthalate film and which is of a pre-set circuit pattern. After removal of the unexposed portion by washing with water, followed by development, the coating film having the circuit pattern was heated at 150° C. for 30 minutes for forming the circuit pattern having the cured coating film pattern. The printed board having the cured coating film patterns formed thereon is termed the Example 1. Cured coating film patterns were similarly formed on circuit boards for the Example 3 and the

TABLE 1

| | | | Example | | | Comparative Example | | | |
|---|---|---|---|---|---|---|---|---|---|
| | | | 1 | 2 | 3 | 1 | 2 | 3 | 4 |
| Composition | Resin Derivative | Kind | A-1 | A-2 | A-2 | A-1 | A-2 | A-2 | A-1 |
| | Solution | Parts | 135 | 145 | 145 | 135 | 145 | 145 | 135 |
| | Photopolymerization | Kind | A | B | A | A | B | A | A |
| | Initiator | Parts | 3 | 5 | 5 | 3 | 5 | 5 | 3 |
| | Pigment (phthalocyaninegreen) | Parts | 0.5 | 0.5 | 0.5 | 0.5 | 0.5 | 0.5 | 0.5 |
| | Mica C | Parts | 15 | | | | | | |
| | Mica D | Parts | | 50 | | | | | |
| | Mica E | Parts | | | 30 | | | | 9 |
| | Mica F | Parts | | | | | 50 | | |
| | Barium Sulfate | Parts | 30 | | | 50 | | 30 | 45 |
| | Pulverized Talc | Parts | | | 20 | | | 20 | |
| | Hydrophobic Silica | Parts | | | 5 | | | 5 | |
| | MODA FLOW | Parts | 1.5 | 1.5 | 1.5 | 1.5 | 1.5 | 1.5 | 1.5 |
| | Deionized Water | Parts | | 110 | | | 110 | | |
| | Coating Method | | Printing | Spraying | Printing | Printing | Spraying | Printing | Printing |

In the above Table 1, the photopolymerization initiator A denotes α-hydroxy isobutylphenone and B denotes benzoin monoethyl ether. Micas C, D, E and F indicate micas having the mean particle size of 7.6 μm, 5.3 μm, 2.4 μm and 0.5 μm, respectively. The mica F was obtained by pulverization using a jet-mill followed by classification. Meanwhile, "MODAFLOW" denotes a surface conditioner prepared by MONSANT COMPANY, USA.

That is, the photopolymerizable composition of Example 1, for example, was produced by dispersing 185 parts of the resin derivative solution A-1, 3 parts of α-hydroxy isobutylphenone, 0.5 part of Phthalocyan Green, 15 parts of mica C, 30 parts of barium sulfate and 1.5 part of MODAFLOW in water, as shown in Table 1, and kneading the dispersion with a test roll.

Comparative Examples 1, 3 and 4. However, in the Example 2 and the Comparative Example 2, the photopolymerizable composition was sprayed on circuit portions of the printed boards similar to those of the Example 1, using a high-speed rotating disc type electro-static coater, to a dry film thickness of 7 to 10 μm. The photopolymerizable composition was produced in the same manner as in Example 1 otherwise. The photopolymerizable compositions produced in this manner are termed the Example 2 and the Comparative Example 2 for convenience.

The characteristics of the Examples 1 to 3 and the Comparative Examples 1 to 4 were checked by the following methods. The results are shown in Table 2.

TABLE 2

|  |  |  |  | Example | | | Comparative Example | | | |
|---|---|---|---|---|---|---|---|---|---|---|
|  |  |  |  | 1 | 2 | 3 | 1 | 2 | 3 | 4 |
| Check Items | Picture Forming Properties | Volume of Light Exposure | Water-Washing Time |  |  |  |  |  |  |  |
|  |  | 400 mj/cm² | 90 sec. | ◎ | ◎ | ◎ | ◎ | ◎ | ◎ | ◎ |
|  |  |  | 180 sec. | ◎ | ◎ | ◎ | ◎ | ◎ | ◎ | ◎ |
|  |  | 800 mj/cm² | 90 sec. | ◎ | ◎ | ◎ | ◎ | ◎ | ◎ | ◎ |
|  |  |  | 180 sec. | ◎ | ◎ | ◎ | ◎ | ◎ | ◎ | ◎ |
|  | Initial Adhesion |  |  | ◎ | ◎ | ◎ | ◎ | ◎ | ◎ | ◎ |
|  | Intimate Adhesion After Soldering |  | After 3 cycles | ◎ | ◎ | ◎ | Δ | O | O | O |
|  |  |  | After 8 cycles | ◎ | ◎ | ◎ | X | Δ | X | X |
|  | Storage Stability |  |  | >6 months | >6 months | >6 months | >6 months | >6 months | >6 months | >6 months |

In the above Table 2, the item "picture forming properties" refers to the development degree of the through-hole on spraying water onto the coating film exposed to light during the picture forming process at 25° C. under a spraying pressure of 2 kg/cm² for pre-set time durations of 90 and 180 seconds. In the above Table 2, the double circle mark denotes the state in which the throughhole has completely been developed as far as its inner surface, the circle mark O denotes the state in which the coating film surface has completely been developed, the triangle mark Δ denotes that there are portion on the coating film surface which cannot be developed or that the picture suffers from defects due to erosion or bloating by the developing solution, and the mark x denotes that development has hardly been achieved.

In the above Table 2, the item "Intimate Initial Adhesion" denotes the state of peeling of an adhesive tape (CT-24 manufactured by NICHIBAN CO. LTD.) as measured with a microscope with a magnification factor of 40, in which the tape was applied under pressure on the cured coating film pattern of 100 μm formed on the printed board in the Examples and in the Comparative Examples and was peeled off quickly. In the Table 2, the double circles indicate the peeling-free state and the mark x indicates that there exists peeling.

In the above Table 2, the item "Intimate Adhesion after Soldering" denotes the state of peeling of the cured coating film pattern at the corner region, in which the state of peeling was checked in the similar manner to the intimate initial adhesion after executing three cycles each comprised of applying a Rosin based solder flux on the respective Examples and the Comparative Examples, floating the Examples and Comparative Examples thus processed for ten seconds in a soldering bath maintained at 260° C. and allowing the Examples and the Comparative Examples to stand until the temperature is lowered to room temperature. Five of the above cycles were subsequently executed and, after the end of the sum total of eight cycles, the state of peeling was similarly checked. In the above Table 2, the double circles indicate the peeling-free state, the circle mark O denotes the state of slight peeling, with the length of the corner region being 5% of the length of the corner region under evaluation, the triangle mark Δ denotes the state with the length of the corner region being not more than 30% of the length of the corner region under evaluation, and the mark x denotes the state with the length of the corner region being 50% or more of the length of the corner region under evaluation.

In the above Table 2, the item "Storage Stability" was checked by charging the photopolymerizable compositions of the Examples and the Comparative Examples in a glass vial maintained at 100° C. The glass vial was hermetically sealed and allowed to stand in a dark place at 30° C. and the time until marked thickening or gelation was produced was measured.

It is seen from the results of Table 2 that, with the Examples 1 to 3 in which the mean particle size of the mica contained in the photopolymerizable composition is in a range from 1 to 10 μm and the amounts of the mica contained in the photopolymerizable composition are in the range from 10 to 60 parts, satisfactory results could be obtained for the respective characteristics. On the other hand, with the Comparative Examples 1 and 3, not containing the mica, the results of the item "Intimate Adhesion after Soldering" are poor, indicating that the adhesion of the cured coating film of the photopolymerizable composition on the printed board is not improved. In the Comparative Example 2 in which the particle size of the mica contained in the photopolymerizable composition is extremely small and is outside the above range, sufficient results in the intimate adhesion after soldering cannot be produced, although some improvement is achieved. Meanwhile, the mica having the particle size larger than the above range has not been not considered since it has already been confirmed that such mica is not effective to produce a smooth coating film. It has also become clear that, with the Comparative Example 4 in which the content of the mica is less than the above range, the results of the item "Intimate Adhesion after Soldering" are poor, indicating that the adhesion of the cured coating film of the photopolymerizable composition on the printed board is not improved. It is noted that the mica having the particle size larger than the above range has not been considered since it has already been confirmed that, with such mica, the coating viscosity of the photopolymerizable composition is increased significantly.

Preparation of the Photopolymerizable Composition (2)

Using the solutions of the resin derivative solutions A-1 and A-2, the photopolymerizable compositions of Examples 4 to 6 and Comparative Examples 5 to 9 were prepared in accordance with the compositions shown in Table 3.

TABLE 3

| | | | Example | | | Comparative Example | | | | |
|---|---|---|---|---|---|---|---|---|---|---|
| | | | 4 | 5 | 6 | 5 | 6 | 7 | 8 | 9 |
| Composition | Resin Derivative Solution | Kind Parts | A-1 135 | A-2 145 | A-2 145 | A-1 135 | A-2 145 | A-2 145 | A-2 145 | A-2 145 |
| | Polymerizable Unsaturated Monomer | Kind Parts | A 3 | B 12 | C 7 | | | | B 0.5 | B 20 |
| | Photopolymerization Initiator | Kind Parts | D 3 | E 5 | D 5 | D 3 | E 5 | D 5 | E 5 | E 5 |
| | Pigment (phthalocyanine green) | Parts | 0.5 | 0.5 | 0.5 | 0.5 | 0.5 | 0.5 | 0.5 | 0.5 |
| | Barium Sulfate | Parts | 50 | | 30 | 50 | | 30 | | |
| | Pulverized Talc | Parts | | 20 | | | 20 | | 20 | 20 |
| | Hydrophobic Silica | Parts | | | 5 | | | 5 | | |
| | MODA FLOW | Parts | 1.5 | 1.5 | 1.5 | 1.5 | 1.5 | 1.5 | 1.5 | 1.5 |
| | Deionized Water | Parts | | 110 | | | 110 | | 110 | 110 |
| | Coating Method | | Printing | Spraying | Printing | Printing | Spraying | Printing | Printing | Printing |

In the above Table 3, the polymerizable unsaturated monomer A is a compound of the chemical formula 2 in which $R_1$ is a methyl group, $R_2$ is a straight-chained alkylene group having six carbon atoms and $R_4$ is a straight-chained alkyl group having six carbon atoms, n being 0.

In the above Table 3, the polymerizable unsaturated monomer B is a compound of the chemical formula 2 in which $R_1$ is a hydrogen atom, $R_2$ is a straight-chained alkylene group having two carbon atoms and $R_4$ is a straight-chained alkyl group having nine carbon atoms, n being 0, while the polymerizable unsaturated monomer C is a compound of the chemical formula 2 in which $R_1$ is a methyl group, $R_2$ is a straight-chained alkylene group having six carbon atoms and $R_4$ is a branched alkyl group having eight carbon atoms, n being 1.

In the Table 3, the photopolymerization initiator D denotes α-hydroxy isobutylphenone and E denotes benzoin monoethyl ether, while "MODAFLOW" is a surface conditioner manufactured by NONSANT COMPANY, USA.

For example, the photopolymerizable composition of Example 4 is prepared by dispersing 135 parts of the resin derivative solution A-1, 3 parts of the polymerizable unsaturated monomer, 3 parts of α-hydroxy isobutylphenone, 0.5 part of Phthalocyanine Green, 50 parts of barium sulfate and 1.5 part of MODAFLOW, as shown in Table 3, in water and kneading the resulting dispersion with a test roll.

The Examples 5, 6 and the Comparative Examples 5 to 9 were prepared in a similar manner, on the proviso that the Example 5 and the Comparative Example 6 were prepared by dilution in water after kneading without dispersion in water during kneading with the test roll.

Formation of Cured Coating Film Pattern (2)

Using the photopolymerizable compositions of the Examples 4 to 6 and the Comparative Examples 5 to 9, cured coating film patterns were formed on printed boards. For example, the photopolymerizable composition of Example 4 was coated (printed) by the silk screen method on a pre-etched copper through-hole printed circuit board to a dry film thickness of 7 to 10 μm as measured at a planar portion of the circuit to form a coating film which was then dried at 70° C. for ten minutes. The coating film was exposed to light volumes of 400 mj/cm$^2$ and 800 mj/cm$^2$ via a photomask which is formed of polyethylene terephthalate and which has a pre-set circuit pattern. After removal of the unexposed portion by washing with water, followed by development, the coating film having the circuit pattern was heated at 150° C. for 30 minutes for forming the circuit pattern having the cured coating film pattern. The printed board having the cured coating film patterns formed thereon is termed the Example 4. Cured coating film patterns were similarly formed on circuit boards for the Example 6 and the Comparative Examples 5, 7, 8 and 9. These cured coating film patterns are termed the Example 6 and the Comparative Examples 5, 7, 8 and 9. However, in the Example 5 and the Comparative Example 6, the photopolymerizable composition was sprayed on circuit portions of the printed boards similar to those of the Example 4, using a high-speed rotating disc type electro-static coater, to a dry film thickness of 7 to 10 μm. The photopolymerizable composition was produced in the same manner as in Example 1 otherwise. The photopolymerizable compositions produced in this manner are termed the Example 5 and the Comparative Example 6 for convenience.

The characteristics of the Examples 4 to 6 and the Comparative Examples 5 to 9 were checked by the following methods. The results are shown in Table 4.

TABLE 4

| Check Items | Picture Forming Properties | Volume of Light Exposure | Water-Washing Time | Example 4 | Example 5 | Example 6 | Comparative Example 5 | Comparative Example 6 | Comparative Example 7 | Comparative Example 8 | Comparative Example 9 |
|---|---|---|---|---|---|---|---|---|---|---|---|
| | | 400 mj/cm² | 90 sec. | ◎ | ◎ | ◎ | ◎ | ◎ | ◎ | ◎ | ◎ |
| | | | 180 sec. | ◎ | ◎ | ◎ | ◎ | ◎ | ◎ | ◎ | ◎ |
| | | 800 mj/cm² | 90 sec. | ◎ | ◎ | ◎ | ◎ | ◎ | ◎ | ◎ | ◎ |
| | | | 180 sec. | ◎ | ◎ | ◎ | ◎ | ◎ | ◎ | ◎ | ◎ |
| | Initial Adhesion | | | ◎ | ◎ | ◎ | ◎ | ◎ | ◎ | ◎ | ◎ |
| | Intimate Adhesion After Soldering | | After 3 cycles | ◎ | ◎ | ◎ | △ | ○ | ○ | ○ | △ |
| | | | After 8 cycles | ◎ | ◎ | ◎ | X | △ | X | △ | △ |
| | Storage Stability | | | >6 months | >6 months | >6 months | >6 months | >6 months | >6 months | >6 months | >6 months |

In the above Table 4, the item "picture forming properties" refers to the development degree of the through-hole on spraying water onto the coating film exposed to light during the picture forming process at 25° C. under a spraying pressure of 2 kg/cm² for pre-set time durations of 90 and 180 seconds. In the above Table 4, the double circle mark denotes the state in which the through-hole has completely been developed as far as its inner surface, the circle mark O denotes the state in which the coating film surface has completely been developed, the triangle mark Δ denotes that there are portions on the coating film surface which cannot be developed or that the picture suffers from defects due to erosion or bloating by the developing solution, and the mark x denotes that development has hardly been achieved.

In the above Table 4, the item "Intimate Initial Adhesion" denotes the state of peeling of an adhesive tape (CT-24 manufactured by NICHIBAN CO. LTD. ) as measured with a microscope with a magnification factor of 40, in which the tape was applied under pressure on the cured coating film pattern of 100 μm formed on the printed board in the Examples and in the Comparative Examples and was peeled off quickly. In the Table 2, the double circles indicate the peeling-free state and the mark x indicates that there exists peeling.

In the above Table 4, the item "Intimate Adhesion after Soldering" denotes the state of peeling of the cured coating film pattern at the corner region, in which the state of peeling was checked in the similar manner to the intimate initial adhesion after executing three cycles each comprised of applying a Rosin based solder flux on the respective Examples and the Comparative Examples, floating the Examples and Comparative Examples thus processed for ten seconds in a soldering bath maintained at 260° C. and allowing the Examples and the Comparative Examples to stand until the temperature is lowered to room temperature. Five of the above cycles were subsequently executed and, after the end of the sum total of eight cycles, the state of peeling was similarly checked. In the above Table 4, the double circles indicate the peeling-free state, the circle mark O denotes the state of slight peeling, with the length of the corner region being 5% of the length of the corner region under evaluation, the triangle mark Δ denotes the state with the length of the corner region being not more than 30% of the length of the corner region under evaluation, and the mark x denotes triangle mark Δ denotes the state with the length of the corner region being 50% or more of the length of the corner region under evaluation.

In the above Table 4, the item "Storage Stability" was checked by charging the photopolymerizable compositions of the Examples and the Comparative Examples in a glass vial maintained at 100° C. The glass vial was hermetically sealed and allowed to stand in a dark place at 30° C. and the time until marked thickening or gelation is produced was measured.

It is seen from the results of Table 4 that good results could be obtained for each of the characteristics with the Examples 4 to 6 for which the polymerizable unsaturated monomer was contained in a specified amount in the photopolymerizable composition. It is also seen that the results on intimate adhesion after soldering were not good with the Comparative Examples 5 to 7 not containing the polymerizable unsaturated monomer, such that the cured coating film of the photopolymerizable composition was not improved in adhesion to the printed board, and that the results on intimate adhesion after soldering were not good for the Comparative Examples 8 and 9 for which the content of the polymerizable unsaturated monomer was outside the above range, such that the cured coating film of the photopolymerizable composition was not improved in adhesion to the printed board.

What is claimed is:

1. A photopolymerizable composition comprising:

(a) an aromatic epoxy resin derivative having from about 0.3 to about 10 mols/kg of polymerizable unsaturated groups and from about 0.1 to about 3 mols/kg of non-protonic onium salt containing groups having the formula:

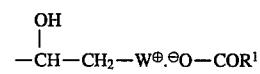

wherein $R^1$ is hydrogen or a hydrocarbon group having 1 to 8 carbons optionally substituted with a hydroxy group, an alkoxy group, an ester group or a halogen group and $w^{\oplus}$ is selected from onium salt-containing groups having the formula:

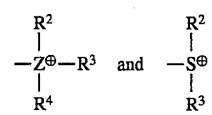

wherein Z is N or P, $R^2$, $R^3$ and $R^4$ may be the same or different and are selected from organic groups containing 1 to 14 carbons and wherein $R^2$ and $R^3$ or $R^2$, $R^3$ and $R^4$ together, respectively, may form a heterocyclic group together with a nitrogen atom, phosphorus atom or a sulfur atom;

(b) from about 0.1 to about 10 parts by weight per 100 parts by weight of component (a) of a photopolymerization initiator; and (c) from 10 to about 60 parts by weight per 100 parts by weight of component (a) of finely-divided mica having a mean particle size of from about 1 to about 10 μm.

2. The composition claimed in claim 1, wherein the aromatic epoxy resin derivative has a weight average molecular weight of about 500 to about 5000.

3. The composition claimed in claim 1, wherein the aromatic epoxy resin derivative has the polymerizable unsaturated group content of 0.5 to 5 moles per kilogram of resin solids.

4. The composition claimed in claim 1, wherein the aromatic epoxy resin derivative has the nonprotonic onium salt containing group content of 0.3 to 2 moles per kilogram of resin solids.

5. A photopolymerizable composition consisting:

(a) an aromatic epoxy resin derivative having from about 0.3 to about 10 mols/kg of polymerizable unsaturated groups and from about 0.1 to about 3 mols/kg of non-protonic onium salt containing groups having the formula:

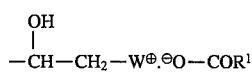

wherein $R^1$ is hydrogen or a hydrocarbon group having 1 to 8 carbons optionally substituted with s hydroxy group, an alkoxy group, an ester group or a halogen group and $W^{\oplus}$ is selected from onium salt-containing groups having the formula:

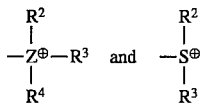

wherein Z is N or P, $R^2$, $R^3$ and $R^4$ may be the same or different and are selected from organic groups containing 1 to 14 carbons and wherein $R^2$ and $R^3$ or $R^2$, $R^3$ and $R^4$ together, respectively, may form a heterocyclic group together with a nitrogen atom, phosphorus atom or a sulfur atom;

(b) from about 0.1 to about 10 parts by weight per 100 parts by weight of component (a) of a photopolymerization initiators and (c) from about 1 to about 15 parts by weight per 100 parts by weight or component (a) of a mono-functional polymerizable unsaturated monomer having the formula:

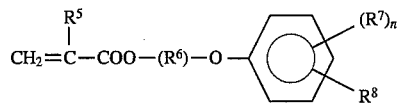

wherein $R^5$ is hydrogen or methyl, $R^6$ is an alkylene group having 1 to 12 carbons, $R^7$ is an alkyl group having 1 to 4 carbons, $R^8$ is an alkyl group having 5 to 12 carbons and n is an integer of 0 to 3, inclusive.

6. A photopolymerizable composition as defined in claim 5, wherein component (a) has a weight average molecular weight of from about 500 to about 5,000.

7. A photopolymerizable composition as defined in claim 5, wherein component (a) has a polymerizable unsaturated group content of from about 0.5 to about 5 mols/kg of resin solids.

8. A photopolymerizable composition as defined in claim 5, wherein component (a) has a non-protonic onium salt containing group content of from about 0.3 to about 2 mols/kg of resin solids.

9. A photopolymerizable composition as defined in claim 5, further including a solvent.

10. A photopolymerizable composition as defined in claim 5, further including from about 0.1 to about 10 parts by weight based on 100 parts by eight of component (a) of a thermal curing catalyst.

11. A photopolymerizable composition as defined in claim 5, further including at least one additive selected from the group consisting or colored pigments, extenders, rust-proofing pigments, dyestuffs, levelling agents, deforming agents and run-proofing agents.

12. A photopolymerizable composition as defined in claim 5, wherein said means-functional polymerizable unsaturated monomer component (c) is an alkyl-substituted phenoxy-alkyl acrylate or an alkyl-substituted phenoxy-alkyl methacrylate.

13. A photopolymerizable composition as defined in claim 5, wherein component (c) is selected from hexylphenoxy-hexyl methacrylate or $c_1$-$c_4$ alkyl branched octylphenoxy-hexyl methacrylate.

14. A method for producing a cured coating film pattern comprising the steps of preparing a photopolymerizable composition as defined in claim 1 or 5, coating the photopolymerizable composition on a substrate to form a coating film on the substrate, drying the coating film, exposing said coating film to light via a photomask having a desired circuit pattern, rinsing the coating film with water for removing an unexposed portion and subjecting the coating film carrying the circuit pattern to heating.

* * * * *